United States Patent
Lim et al.

(10) Patent No.: US 11,664,317 B2
(45) Date of Patent: May 30, 2023

(54) REVERSE-BRIDGE MULTI-DIE INTERCONNECT FOR INTEGRATED-CIRCUIT PACKAGES

(71) Applicant: Intel Corporation, Santa Clara, CA (US)

(72) Inventors: Min Suet Lim, Simpang Ampat (MY); Eng Huat Goh, Penang (MY); MD Altaf Hossain, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 16 days.

(21) Appl. No.: 17/024,263

(22) Filed: Sep. 17, 2020

(65) Prior Publication Data

US 2021/0183775 A1 Jun. 17, 2021

(30) Foreign Application Priority Data

Dec. 17, 2019 (MY) .............................. PI2019007530

(51) Int. Cl.
| | | |
|---|---|---|
| *H01L 23/538* | (2006.01) | |
| *H01L 23/522* | (2006.01) | |
| *H01L 23/31* | (2006.01) | |
| *H01L 23/50* | (2006.01) | |
| *H01L 23/498* | (2006.01) | |
| *H01L 25/065* | (2023.01) | |
| *H01L 49/02* | (2006.01) | |
| *H01L 21/56* | (2006.01) | |

(52) U.S. Cl.
CPC ........ *H01L 23/5384* (2013.01); *H01L 21/565* (2013.01); *H01L 23/31* (2013.01); *H01L 23/5223* (2013.01); *H01L 23/5385* (2013.01); *H01L 23/5386* (2013.01); *H01L 28/40* (2013.01)

(58) Field of Classification Search
CPC .. H01L 23/5384; H01L 23/31; H01L 23/5223
See application file for complete search history.

(56) References Cited

U.S. PATENT DOCUMENTS

| | | | | |
|---|---|---|---|---|
| 2016/0086930 A1* | 3/2016 | Koey | .................. | H01L 25/0652 257/773 |
| 2016/0358889 A1* | 12/2016 | Lai | ....................... | H01L 23/5383 |
| 2017/0092621 A1* | 3/2017 | Das | ..................... | H01L 23/5283 |

* cited by examiner

*Primary Examiner* — Omar F Mojaddedi
(74) *Attorney, Agent, or Firm* — Schwegman Lundberg & Woessner, P.A.

(57) ABSTRACT

Disclosed embodiments include die-edge level passive devices for integrated-circuit device packages that provide a low-loss path to active and passive devices, by minimizing inductive loops.

19 Claims, 7 Drawing Sheets

REVERSE-BRIDGE MULTI-DIE INTERCONNECT FOR INTEGRATED-CIRCUIT PACKAGES

PRIORITY APPLICATION

This application claims the benefit of priority to Malaysian Application Serial Number PI2019007530, filed Dec. 17, 2019, which is incorporated herein by reference in its entirety.

FIELD

This disclosure relates to locating passive devices close to integrated-circuit devices as part of integrated-circuit device packages.

BACKGROUND

Signal and power integrity is challenging for complex packaging of integrated-circuit components coupled to packages and boards. Challenges include such issues as inductance loops and impedance peak profiles that hinder utility.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Disclosed embodiments include locating passive devices beside integrated-circuit (IC) die edges, and connecting the IC dice and the passive devices through interconnect bridges. In several embodiments, locating the passive devices beside the IC die edges includes the passive device occupies at least some of latitude (Z-height) occupied by the IC die edge. In several embodiment, locating the passive devices beside the IC die edges includes the passive device is at the IC die edge, and coupled from the IC die back-side.

Arrays of passive devices, such as decoupling capacitors, include multi-layer ceramic capacitors (MLCCs) according to an embodiment. Arrays of passive devices, such as silicon-based capacitors (metal-insulator-metal or MIM) are included according to an embodiment.

Interconnecting bridges include silicon interconnect bridges according to an embodiment. In some embodiments, only interconnects are contained within the silicon bridge. Interconnecting bridges include organic, printed-wiring board type interconnect bridges according to an embodiment. In some embodiments, only lithographically formed interconnects are in the reverse bridge, that are smaller than interconnects in a motherboard that is coupled to the reverse bridge. In some embodiments, the interconnect bridges are above an IC die with respect to the location of an integrated-circuit package substrate, such that the interconnect bridges are "reverse bridge" configurations.

Figure 1:
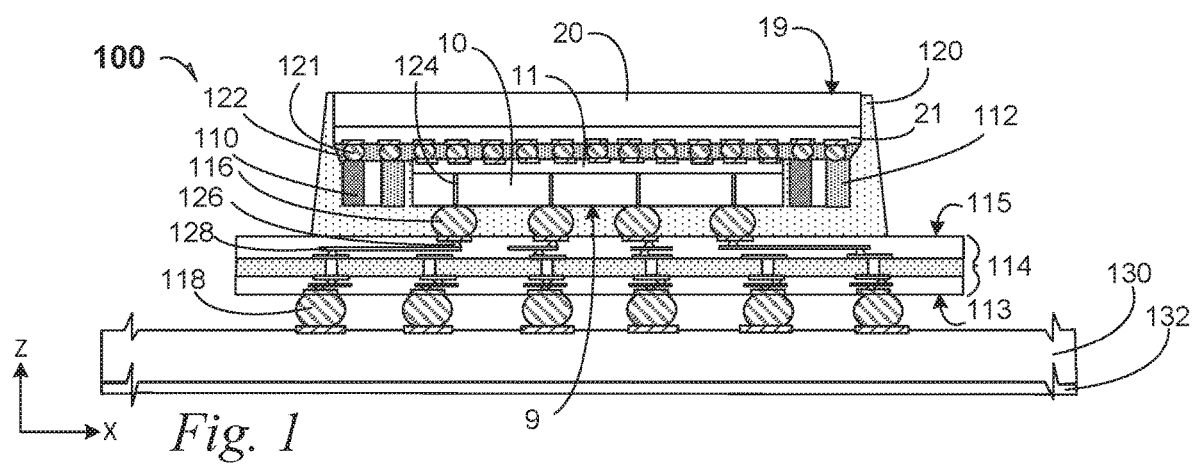
FIG. 1 is a cross-section elevation of an integrated-circuit device package with a die-edge-level passive device that is coupled to an integrated-circuit die, through a reverse-bridge configuration according to several embodiments.

FIG. 1 is a cross-section elevation of an integrated-circuit device package 100 with a die-edge-level passive device 110 that is coupled to an integrated-circuit die 10, through a reverse-bridge 20 configuration according to several embodiments. A "reverse bridge" may be understood to be a bridge that is above an IC die, such as above the IC die 10.

In an embodiment, the die-edge level passive device 110 is a first passive device 110, and a subsequent die-edge level passive device 112 is located opposite the first passive device 110, across the first IC die 10. As illustrated, the first passive device 110 and the subsequent passive device 112 are suspended from the compute IC die 20 at opposite sides, and each of the first and subsequent passive devices 110 and 112, occupy at least some of the same latitude (Z-height) occupied by the IC die 10. With respect to the space relationship of the first and subsequent passive devices 110 and 112, they are also located near the die edges of the subsequent IC die 20, while occupying edge space of the first IC die 10.

The first IC die 10 is seated on an integrated-circuit package substrate 114, on a die-side surface 115. A land side 113 is opposite the die side 115. The first IC die 10 is coupled to the IC package substrate 114 by a micro bump 116 (also referred to as an electrical bump 116) according to several embodiments. The "micro bump" 116 may be distinguished from larger bumps, e.g. item 118 (also referred to as board-side bumps 118), and where the micro bump 116 has a measurement in micrometers, which may be less than 1,000 micrometer (μm) in diameter. Further, the "micro bump" 116 may be distinguished from other electrical bumps, where the "micro bump" 116 is a "zeroth level" interconnect (ZLI) 116 compared to the board-side bumps 118, which is a first-level interconnect (FLI) 118.

Communication between the first IC die 10, to the first and subsequent passive devices 110 and 112, is through the subsequent IC die 20, where the subsequent IC die 20 acts as a "reverse bridge" interconnect, and where the first and subsequent passive devices 110 and 112 are mounted "opossum" style, on the subsequent IC die 20, and at the lateral edges of the first IC die 10. In an embodiment, the first IC die 10 is referred to as a base die 10, and the subsequent IC die 20 is referred to as a compute die 20. For example in an embodiment, the compute die 20 is a logic processor die 20 such as a processor made by Intel Corporation of Santa Clara, Calif. and the base die 10 is a controller die 10 such as an input/output (I/O) controller hub 10. In an embodiment, the base die 10 is a memory controller hub (MCH) and the compute die 20 is a logic processor.

In an embodiment, the passive devices 110 and 112 are overmolded, along with the first IC die 10 in a molding mass 120, where the molding mass 120 also at least partially encapsulates the subsequent IC die 20.

As illustrated, the first IC die 10 and the subsequent IC die 20, are face-to-face mounted at an electrical bump array 121, such that first-die active devices and metallization 11 of the first IC die 10 are face-to-face mounted against subsequent-die active devices and metallization 21 of the subsequent IC die 20. Consequently, a first-die backside surface 9 is opposite the first-die active devices and metallization 11, and a subsequent-die back-side surface 19 is opposite the subsequent-die active devices and metallization 21. In an embodiment, an underfill material 122 is pre-flowed between the two active devices and metallization 11 and 21, to assist structural cohesion during further assembly such as during overmolding of the molding mass 120. In an embodiment, the underfill material 122 also is flowed between the passive devices 110 and 112 and the subsequent IC die 20.

In an embodiment, heat management is done by assembling an integrated heat spreader to the back-side surface 19, and to the printed wiring board 130. Such an integrated heat spreader (IHS) is referred to as a "lid."

Electrical connection between the first IC die 10 and the IC package substrate 114 is accomplished by through-silicon vias (TSVs) 124 to the first IC die back-side surface 9, into a land-side electrical bump 116, and into vias 126 and traces 128, and to the board-side bumps 118.

The signal path, as well and power (Vcc) and ground (Vss)_connections, further continue from the land-side electrical bump 118 into a printed wiring board 130 such as a motherboard, or a printed wiring board, in a computing system. In an embodiment, the board 130 has an external shell 132 that provides at least one of physical and electrical insulative protection for components on the board 130. For example, the external shell 132 is an integral portion of the board 130, that is part of a hand-held computing system such as a communication device. In an embodiment, the external shell 132 is an integral portion of the board 130, that is part of the exterior of a mobile computing platform such as a drone.

Figure 1A:
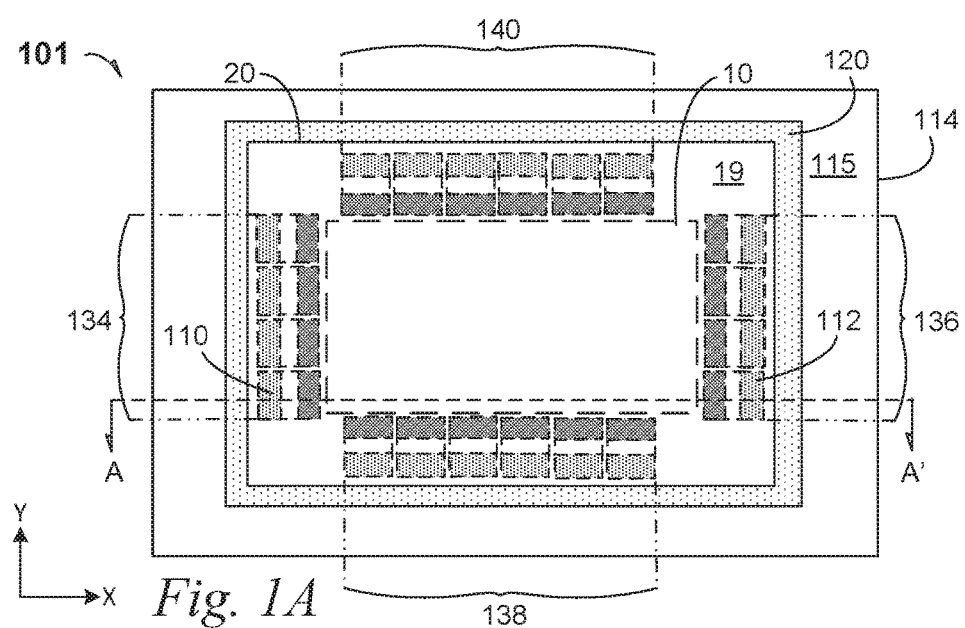
FIG. 1A is a top plan of an integrated-circuit device package such as the IC device package depicted in FIG. 1 according to several embodiments.

FIG. 1A is a top plan of an integrated-circuit device package 101 such as the IC device package 110 depicted in FIG. 1 according to several embodiments. A cross-section view of FIG. 1 is taken along the line A-A'. The board 130 is not illustrated.

The first IC die 10 is depicted in ghosted lines to illustrate it is below the subsequent IC die 20. Similarly, the first and subsequent passive devices 110 and 112 are also depicted in ghosted lines as they are suspended below the subsequent IC die 20.

In an embodiment, the first passive device 110 is part of a strip of passive devices 134 such as a strip of decoupling capacitors 134 that service the subsequent IC die 20 such as when the subsequent IC die 20 is a logic processor 20. In an embodiment, the first strip of passive devices 134 is a single decoupling capacitor that takes a form factor approximately as illustrated. In an embodiment, the first strip of passive devices 134 is a group of four passive devices. In an embodiment, up to 27 passive devices are part of the first strip of passive devices 134.

Similarly in an embodiment, the subsequent passive device 112 is part of a subsequent strip of passive devices 136 such as a strip of decoupling capacitors 136 that service the subsequent IC die 20. In an embodiment, the subsequent strip of passive devices 136 is a single decoupling capacitor that takes a form factor approximately as illustrated. In an embodiment, the subsequent strip of passive devices 136 is a group of four passive devices. In an embodiment, up to 27 passive devices are part of the subsequent strip of passive devices 134.

In an embodiment, a third strip of passive devices 138 such as a strip of decoupling capacitors 138 are also suspended from the subsequent IC die 20. In an embodiment, the third strip of passive devices 138 is a single decoupling capacitor that takes a form factor approximately as illustrated. In an embodiment, the third strip of passive devices 138 is a group of six passive devices. In an embodiment, up to 37 passive devices are part of the third strip of passive devices 138.

In an embodiment, a fourth strip of passive devices 140 such as a strip of decoupling capacitors 140 are also suspended from the subsequent IC die 20. In an embodiment, the fourth strip of passive devices 140 is a single decoupling capacitor that takes a form factor approximately as illustrated. In an embodiment, the fourth strip of passive devices 140 is a group of six passive devices. In an embodiment, up to 37 passive devices are part of the fourth strip of passive devices 140.

Figure 2:
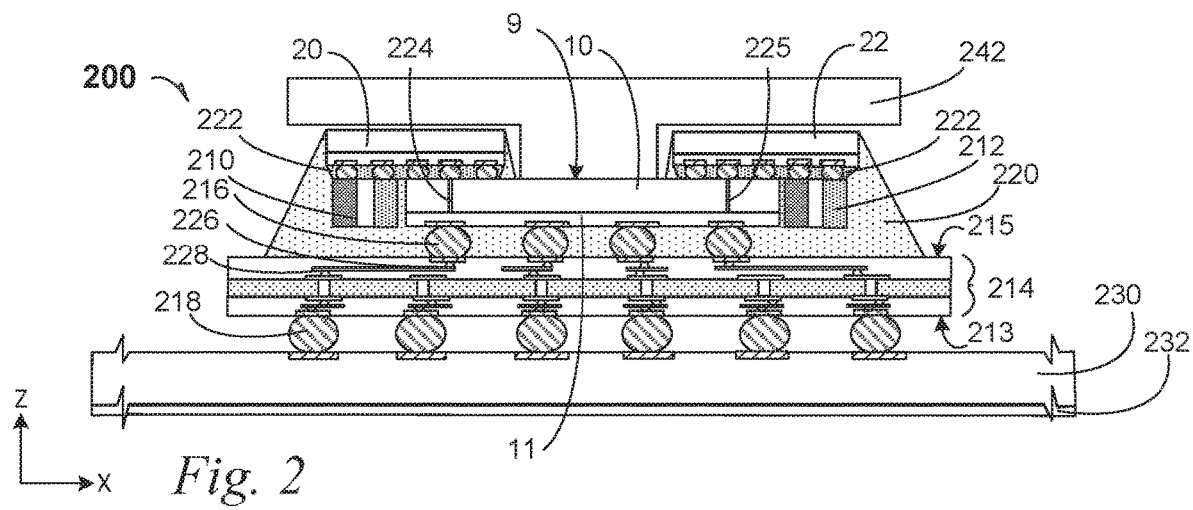
FIG. 2 is a cross-section elevation of an integrated-circuit device package with a die-edge-level passive device that is coupled to an integrated-circuit die, through at least two reverse-bridge configurations according to several embodiments.

FIG. 2 is a cross-section elevation of an integrated-circuit device package 200 with a die-edge-level passive device 210 that is coupled to an integrated-circuit die 10, through at least two reverse-bridge configurations 20 and 22 according to several embodiments. In an embodiment, the reverse-bridge dice 20 and 22 are referred to as silicon-bridge dice 20 and 22. In an embodiment, the die-edge level passive device 210 is a first passive device 210, and a subsequent die-edge level passive device 212 is located opposite the first passive device 212, across the first IC die 10.

By contrast to embodiments illustrated for FIGS. 1 and 1A, the first IC die 10 is a compute IC die 10 according to an embodiment. The compute IC die 10 is flip-chip seated on an integrated-circuit package substrate 214, on a die-side surface 215. A land side 213 is opposite the die side surface 215. The first IC die 10 is coupled to the IC package substrate 214 by a micro bump 216 (also referred to as a bump 216) according to several embodiments. The "micro bump" 216 may be distinguished from larger bumps, e.g. item 218 (also referred to as board-side bumps 218), and where the micro bump 216 has a measurement in micrometers, which may be less than 1,000 micrometer (μm) in diameter. Further, the "micro bump" 216 may be distinguished from other electrical bumps, where the "micro bump" 216 is a zeroth-level interconnect (ZLI) 216 compared to the board-side bumps 218. Communication between the micro bumps 216 and the board-side bumps 218 is accomplished within the IC package substrate 214, by vias 226 and traces 228.

Communication between the first IC die 10, to the first and subsequent passive devices 210 and 212, is through the subsequent IC dice 20 and 22, where the subsequent IC dice 20 and 22 act as "reverse bridges" and where the first and subsequent passive devices 210 and 212 are mounted "opossum" style, on the respective subsequent IC dice 20 and 22, and at the lateral edges of the first IC die 10. In an embodiment, the first IC die 10 is referred to as a compute die 10, and the subsequent IC dice 20 and 22 are referred to as reverse embedded multi-die interconnect bridges REMIBs 20 and 22. For example in an embodiment, the compute die 10 is a logic processor die 10 such as a processor made by Intel Corporation of Santa Clara, Calif., and the subsequent IC dice 20 and 22 are silicon bridges 20 and 22. In an embodiment, the reverse IC dice 20 and 22 are memory dice 20 and 22, with silicon-bridge capabilities, to facilitate decoupling capacitors 210 and 212 to service the compute die 10.

In an embodiment, the passive devices 210 and 212 are overmolded along with the first IC die 10 and the reverse-bridge dice 20 and 22, in a molding mass 220, where the molding mass 220 also at least partially encapsulates the reverse-bridge dice 20 and 22.

As illustrated, the first IC die 10 is flip-chip mounted on the IC package substrate 214 at the die side 215, at an electrical bump array, such that first-die active devices and metallization 11 of the first IC die 10 are mounted facing the IC package substrate 214. In an embodiment, underfill materials 222 are pre-flowed between the first IC die back-side surface 9, the first and subsequent passive devices 210 and 212, and the reverse-bridge dice 20 and 22, to assist structural cohesion during further assembly such as during overmolding of the molding mass 220.

Electrical connection between the first IC die and the reverse-bridge dice 20 and 22 is accomplished by through-silicon vias (TSVs) 224 and 225, respectively, to the first IC die back-side surface 9.

In an embodiment, the IC package substrate 214 is seated on a printed wiring board 230 such as a motherboard, or a printed wiring board, in a computing system. In an embodiment, the board 230 has an external shell 232 that provides at least one of physical and electrical insulative protection for components on the board 230. For example, the external shell 232 is an integral portion of the board 230, that is part of a hand-held computing system such as a communication device or a tablet computing system. In an embodiment, the external shell 232 is an integral portion of the board 230, that is part of the exterior of a mobile computing platform such as a drone.

In an embodiment, an enabling thermal solution is provided by a heat spreader 242 that is seated on the first IC die back-side surface 9, where the heat spreader 242 also may contact the reverse-bridge dice 20 and 22, whether for package stability or where the reverse-bridge IC dice 20 and 22 also are heat-generating IC dice 20 and 22. In an embodiment, heat management is done by assembling an integrated heat spreader ("lid") to the heat spreader 242, and to the printed wiring board 230.

Figure 2A:
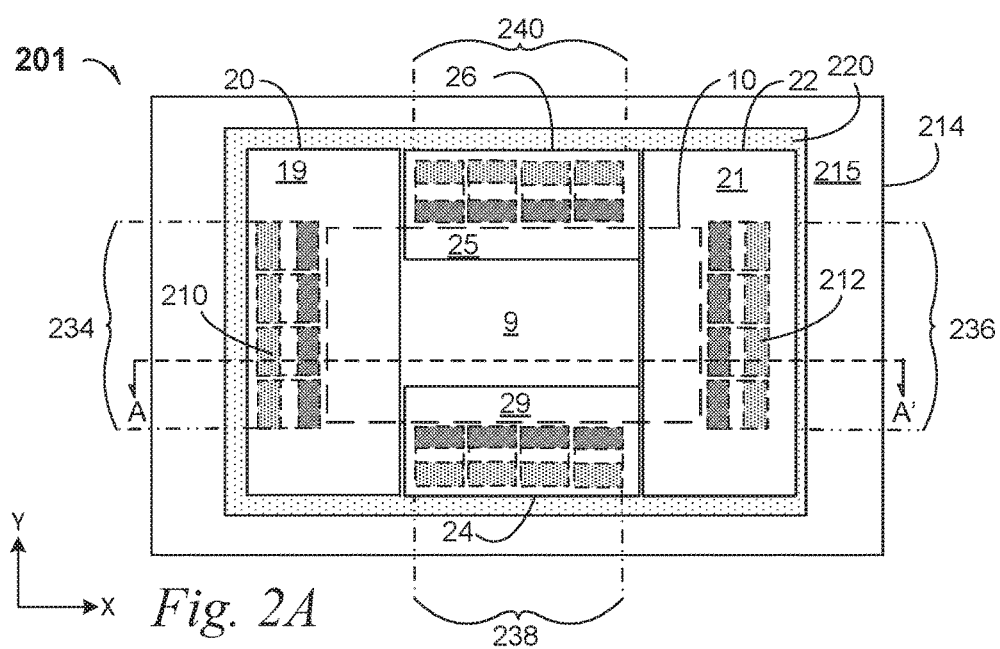
FIG. 2A is a top plan of an integrated-circuit device package such as the IC device package depicted in FIG. 2 according to several embodiments.

FIG. 2A is a top plan of an integrated-circuit device package 201 such as the IC device package 200 depicted in FIG. 2 according to several embodiments. A cross-section view of FIG. 2 is taken along the line A-A'. The board 230 is not illustrated. Further, the heat sink 242 is not illustrated.

The first IC die 10 is depicted in ghosted lines below the first and subsequent reverse-bridge dice 20 and 22, and the first die back-side surface 9 is partially exposed between the two reverse-bridge dice 20 and 22. The first and subsequent passive devices 210 and 212 are also depicted in ghosted lines as they are suspended below the subsequent IC die 20. In an embodiment, third and fourth reverse-bridge dice 24 and 26 are also mounted above the first IC die back-side surface 9.

In an embodiment, the first passive device 210 is part of a strip of passive devices 234 such as a strip of decoupling capacitors 234 that service the IC die 10 and where useful, the first reverse-bride die 20, such as when the IC die 10 is a logic processor 10. In an embodiment, the first strip of passive devices 234 is a single decoupling capacitor that takes a form factor approximately as illustrated. In an embodiment, the first strip of passive devices 234 is a group of four passive devices. In an embodiment, up to 27 passive devices are part of the first strip of passive devices 234 within the approximate form factor of the four strip of first passive devices 234.

Similarly in an embodiment, the subsequent passive device 212 is part of a subsequent strip of passive devices 236 such as a strip of decoupling capacitors 236 that service the IC die 10 and where useful, the first reverse-bride die 20. In an embodiment, the subsequent strip of passive devices 236 is a single decoupling capacitor that takes a form factor approximately as illustrated. In an embodiment, the subsequent strip of passive devices 236 is a group of four passive devices. In an embodiment, up to 27 passive devices are part of the subsequent strip of passive devices 236 within the approximate form factor of the four strip of subsequent passive devices 236.

In an embodiment, a third strip of passive devices 238 such as a strip of decoupling capacitors 238 are also suspended from the third bridge die 24. In an embodiment, the third strip of passive devices 238 is a single decoupling capacitor that takes a form factor approximately as illustrated. In an embodiment, the third strip of passive devices 238 is a group of four passive devices. In an embodiment, up to 37 passive devices are part of the third strip of passive devices 238 within the approximate form factor of the four third strip of passive devices 238.

In an embodiment, a fourth strip of passive devices 240 such as a strip of decoupling capacitors 240 are suspended from the fourth bridge die 26. In an embodiment, the fourth strip of passive devices 240 is a single decoupling capacitor that takes a form factor approximately as illustrated. In an embodiment, the fourth strip of passive devices 240 is a group of four passive devices. In an embodiment, up to 37 passive devices are part of the fourth strip of passive devices 240 within the approximate form factor of the four fourth strip of passive devices 238.

Figure 3:
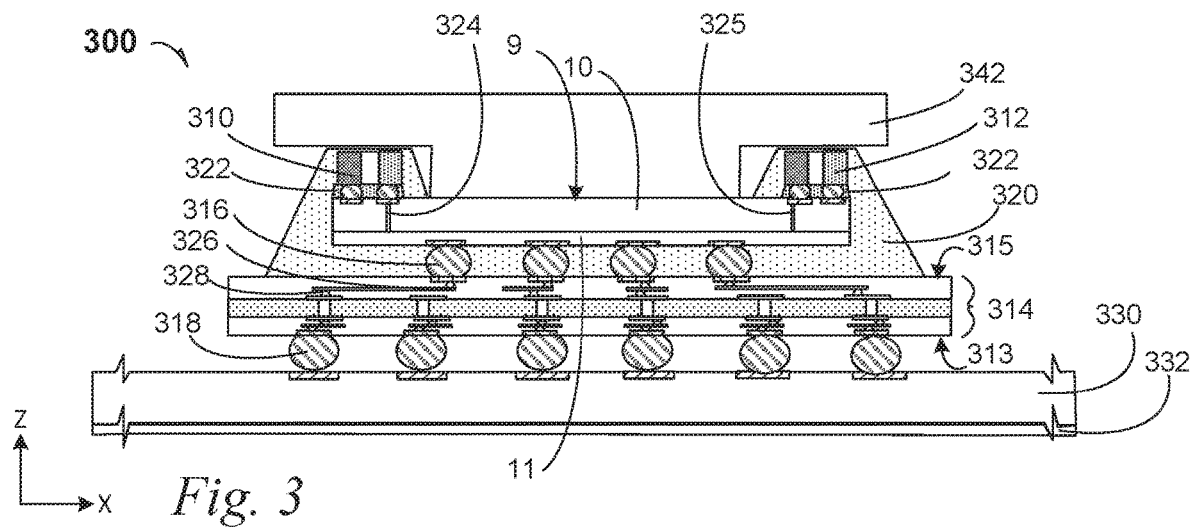
FIG. 3 is a cross-section elevation of an integrated-circuit device package with a die-backside-mounted passive device that is coupled to an integrated-circuit die according to several embodiments.

FIG. 3 is a cross-section elevation of an integrated-circuit device package 300 with a die-backside-mounted passive device 310 that is coupled to an integrated-circuit die 10 according to several embodiments. In an embodiment, the die-backside-mounted passive device 310 is a first passive device 310, and a subsequent die-backside-mounted passive device 312 is located opposite the first passive device 312, across a backside 9 of the first IC die 10.

The first IC die 10 is seated on an integrated-circuit package substrate 314, on a die-side surface 315. A land side 313 is opposite the die side 315. The first IC die 10 is coupled to the IC package substrate 314 by a micro bump 316 (also referred to as a bump 316) according to several embodiments. The "micro bump" 316 may be distinguished from larger bumps, e.g. item 318 (also referred to as board-side bumps 318), and where the micro bump 316 has a measurement in micrometers, which may be less than 1,000 micrometer (µm) in diameter. Further, the "micro bump" 316 may be distinguished from other electrical bumps, where the "micro bump" 316 is a first-level interconnect (FLI) 316 compared to the board-side bumps 318. Communication between the micro bumps 316 and the board-side bumps 318 is accomplished within the IC package substrate 314, by vias 326 and traces 328.

Communication between the first IC die 10, to the first and subsequent passive devices 310 and 312, is by through-silicon vias (TSVs) 324. In an embodiment, the first IC die 10 is referred to as a compute die 10, for example in an embodiment, the compute die 10 is a logic processor die 10 such as a processor made by Intel Corporation of Santa Clara, Calif., and the first and subsequent passive devices 310 and 312 are decoupling capacitors 310 and 312 to service the compute die 10. As illustrated, the IC die 10 acts as a *sui* generic reverse-bridge for the passive device 310, where the die back-side surface is the effective reverse-bridge structure.

In an embodiment, the passive devices 310 and 312 are overmolded along with the first IC die 10, where the molding mass 220 also at least partially encapsulates the first and subsequent passive devices 310 and 312, and where the molding mass also at least partially encapsulated the IC die 10, except for a portion of the die back-side surface 9.

As illustrated, the first IC die 10 is flip-chip mounted on the IC package substrate 314 at the die-side surface 315, at an electrical bump array, such that first-die active devices and metallization 11 of the first IC die 10 mounted facing the IC package substrate 314. In an embodiment, underfill materials 322 are pre-flowed between the first IC die back-side surface 9, the first and subsequent passive devices 310 and 312, to protect TSV contacts on the back-side surface 9.

Electrical connection between the first IC die and the first and subsequent passive devices 310 and 312 is accomplished by through-silicon vias (TSVs) 324 and 325, respectively, to the first IC die back-side surface 9.

In an embodiment, the IC package substrate 314 is seated on a printed wiring board 330 such as a motherboard, or a printed wiring board, in a computing system. In an embodiment, the board 330 has an external shell 332 that provides at least one of physical and electrical insulative protection for components on the board 330. For example, the external shell 332 is an integral portion of the board 330, that is part of a hand-held computing system such as a communication device. In an embodiment, the external shell 332 is an integral portion of the board 330, that is part of the exterior of a mobile computing platform such as a drone. For all disclosed embodiments in all printed wiring-board disclosures, the external shell may be for a desktop computing system, and in any event for a non-handheld and non-drone computing system.

In an embodiment, an enabling thermal solution is provided by a heat spreader 342 that is seated on the IC die back-side surface 9, where the heat spreader 342 also may contact the passive devices 310 and 312, whether for package stability or using the passive devices 310 and 312 as heat-transferring structures. In an embodiment, heat management is done by assembling an integrated heat spreader "lid" to the heat spreader 342, and to the printed wiring board 330.

Figure 3A:
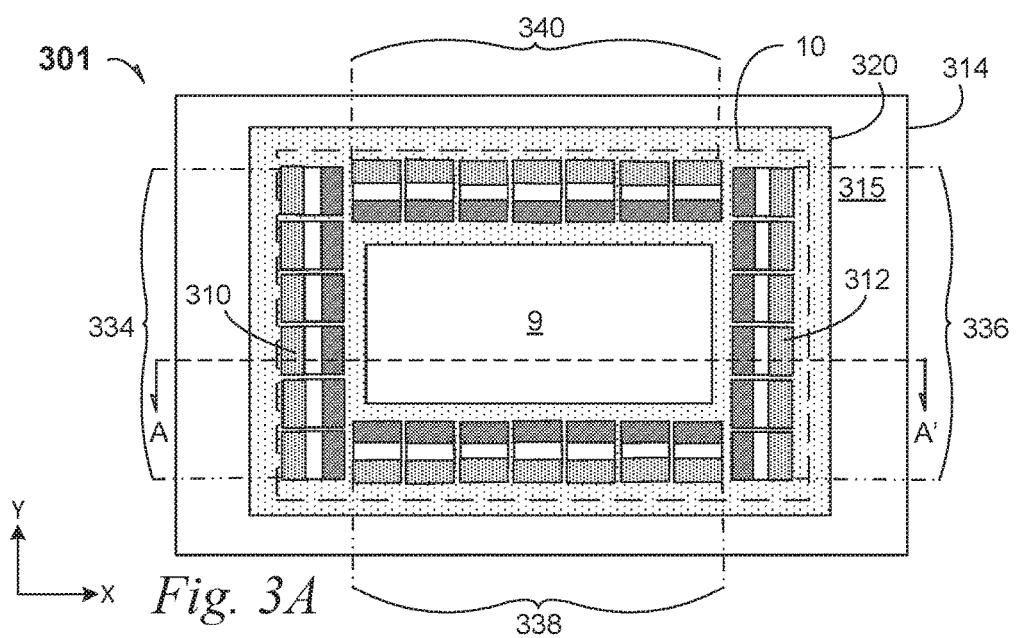
FIG. 3A is a top plan of an integrated-circuit device package such as the IC device package depicted in FIG. 3 according to several embodiments.

FIG. 3A is a top plan of an integrated-circuit device package 301 such as the IC device package 310 depicted in FIG. 3 according to several embodiments. A cross-section view of FIG. 3 is taken along the line A-A'. The board 330 is not illustrated. Further, the heat sink 342 is not illustrated.

The first IC die 10 is depicted in ghosted lines at its perimeter, below the molding mass 320, but the IC die back-side surface 9 is partially exposed at an infield region where the heat sink 342 is to be seated. The first and subsequent passive devices 310 and 212 emerge from the molding mass 320 in an embodiment, and share an essentially common upper-surface height with the molding mass 320 to facilitate seating and stability of the heat sink 342.

In an embodiment, the first passive device 310 is part of a strip of passive devices 334 such as a strip of decoupling capacitors 334 that service the IC die 10 such as when the IC die 10 is a logic processor 10. In an embodiment, the first strip of passive devices 334 is a single decoupling capacitor that takes a form factor approximately as illustrated. In an embodiment, the first strip of passive devices 334 is a group of six passive devices. In an embodiment, up to 27 passive devices are part of the first strip of passive devices 334 within the approximate form factor of the six first-strip of passive devices 334.

Similarly in an embodiment, the subsequent passive device 312 is part of a subsequent strip of passive devices 336 such as a strip of decoupling capacitors 336 that service the IC die 10. In an embodiment, the subsequent strip of passive devices 336 is a single decoupling capacitor that takes a form factor approximately as illustrated. In an embodiment, the subsequent strip of passive devices 336 is a group of six passive devices. In an embodiment, up to 27 passive devices are part of the subsequent strip of passive devices 336 within the approximate form factor of the six third-strip of subsequent passive devices 336.

In an embodiment, a third strip of passive devices 338 such as a strip of decoupling capacitors 338 are also seated on the IC die back-side surface 9 and similarly coupled by TSVs. In an embodiment, the third strip of passive devices 338 is a single decoupling capacitor that takes a form factor approximately as illustrated. In an embodiment, the third strip of passive devices 338 is a group of seven passive devices. In an embodiment, up to 37 passive devices are part of the third strip of passive devices 338 within the approximate form factor of the seven third-strip of passive devices 338.

In an embodiment, a fourth strip of passive devices 340 such as a strip of decoupling capacitors 340 are seated on the IC die backside surface 9 and coupled to the IC die 10 by TSVs. In an embodiment, the fourth strip of passive devices 340 is a single decoupling capacitor that takes a form factor approximately as illustrated. In an embodiment, the fourth strip of passive devices 340 is a group of seven passive devices. In an embodiment, up to 37 passive devices are part of the fourth strip of passive devices 340 within the approximate form factor of the seven fourth-strip of passive devices 338.

Figure 4:
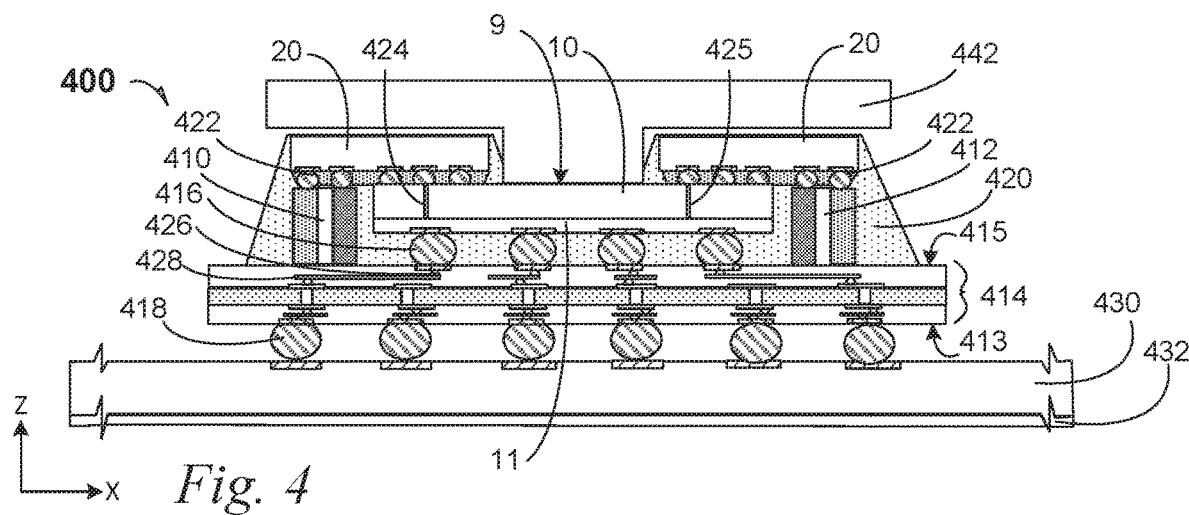
FIG. 4 is a cross-section elevation of an integrated-circuit device package with a die-edge-level passive device that is coupled to an integrated-circuit die, through an organic reverse-bridge configuration according to several embodiments.

FIG. 4 is a cross-section elevation of an integrated-circuit device package 400 with a die-edge-level passive device 410 that is coupled to an integrated-circuit die 10, through an organic reverse-bridge configuration 20 according to several embodiments. In an embodiment, the die-edge level passive device 410 is a first passive device 410, and a subsequent die-edge level passive device 412 is located opposite the first passive device 412, across the first IC die 10. In an embodiment, the passive devices 410 and 412, or one of them, extends from the organic reverse bridge 20, to the die-side surface 415 of the an integrated-circuit package substrate 414.

The first IC die 10 is seated on an integrated-circuit package substrate 414, on the die-side surface 415. A land side 413 is opposite the die side 415. The first IC die 10 is coupled to the IC package substrate 414 by a micro bump 416 (also referred to as a bump 416) according to several embodiments. The "micro bump" 416 may be distinguished from larger bumps, e.g. item 418 (also referred to as board-side bumps 418), and where the micro bump 416 has a measurement in micrometers, which may be less than 1,000 micrometer (μm) in diameter. Further, the "micro bump" 416 may be distinguished from other electrical bumps, where the "micro bump" 416 is a zeroth-level interconnect (ZLI) 416 compared to the board-side bumps 418. Communication between the micro bumps 416 and the board-side bumps 418 is accomplished within the IC package substrate 414, by vias 426 and traces 428.

Communication between the first IC die 10, to the first and subsequent passive devices 410 and 412, is through the organic-bridge 20, where the organic reverse bridge 20 act as a "reverse bridge" and where the first and subsequent passive devices 410 and 412 are mounted "opossum" style, on the organic bridge 20, and at the lateral edges of the first IC die 10. In an embodiment, at least one of the first and subsequent passive devices 410 and 412, extend to and seat on the die-side surface 415, which provides structural stability to the organic reverse bridge 20.

In an embodiment, the first IC die 10 is referred to as a compute die 10, such as a processor made by Intel Corporation of Santa Clara, Calif. In an embodiment, the organic reverse bridge 20 is a frame or rectangular torrid shape with an infield that exposes the IC die backside surface 9 of the IC die 10.

In an embodiment, the passive devices 410 and 412 are overmolded with the IC die 10 and the organic bridge 20, in a molding mass 420, where the molding mass 420 also at least partially encapsulates the organic reverse bridge 20.

As illustrated, the first IC die 10 is flip-chip mounted on the IC package substrate 414 at the die side 415, at an electrical bump array, such that first-die active devices and metallization 11 of the IC die 10 mounted facing the IC package substrate 414. In an embodiment, underfill materials 422 are pre-flowed between the IC die back-side surface 9, the organic reverse bridge 20 and subsequent passive devices 410 and 412, and the organic reverse bridge 20, to assist structural cohesion during further assembly such as during overmolding of the molding mass 420.

Electrical connection between the first IC die and the organic reverse bridge 20 is accomplished by through-substrate vias (TSubVs) 424 and 425, respectively, to the first IC die back-side surface 9.

In an embodiment, the IC package substrate 414 is seated on a printed wiring board 430 such as a motherboard, or a printed wiring board, in a computing system. In an embodiment, the board 430 has an external shell 432 that provides at least one of physical and electrical insulative protection for components on the board 430. For example, the external shell 432 is an integral portion of the board 430, that is part of a hand-held computing system such as a communication device. In an embodiment, the external shell 432 is an integral portion of the board 430, that is part of the exterior of a mobile computing platform such as a drone.

In an embodiment, an enabling thermal solution is provided by a heat spreader 442 that is seated on the first IC die backside surface 9, where the heat spreader 442 also may contact the organic reverse bridge 20, for package stability. In an embodiment an IHS or "lid" is seated on the heat spreader 442 and on the board 430.

Figure 4A:
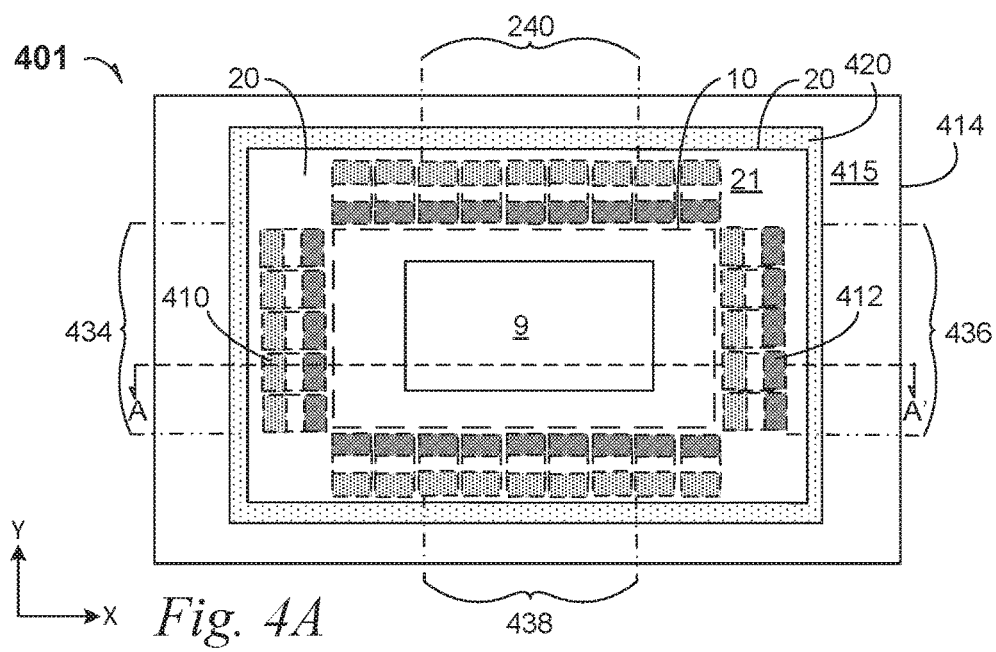
FIG. 4A is a top plan of an integrated-circuit device package such as the IC device package depicted in FIG. 4 according to several embodiments.

FIG. 4A is a top plan of an integrated-circuit device package 401 such as the IC device package 400 depicted in FIG. 4 according to several embodiments. A cross-section view of FIG. 4 is taken along the line A-A'. The board 430 is not illustrated. Further, the heat sink 442 is not illustrated.

The first IC die 10 is depicted in ghosted lines below the organic reverse bridge 20, and the IC die back-side surface 9 is partially exposed at an infield region of the organic reverse bridge 20. The first and subsequent passive devices 410 and 412 are also depicted in ghosted lines as they are suspended below the organic reverse bridge 20.

In an embodiment, the first passive device 410 is part of a strip of passive devices 434 such as a strip of decoupling capacitors 434 that service the IC die 10 such as when the IC die 10 is a logic processor 10. In an embodiment, the first strip of passive devices 434 is a single decoupling capacitor that takes a form factor approximately as illustrated. In an embodiment, the first strip of passive devices 434 is a group of five passive devices. In an embodiment, up to 27 passive devices are part of the first strip of passive devices 434 within the approximate form factor of the five strip of first passive devices 434.

Similarly in an embodiment, the subsequent passive device 412 is part of a subsequent strip of passive devices 436 such as a strip of decoupling capacitors 436 that service the IC die 10. In an embodiment, the subsequent strip of passive devices 436 is a single decoupling capacitor that takes a form factor approximately as illustrated. In an embodiment, the subsequent strip of passive devices 436 is a group of five passive devices. In an embodiment, up to 27 passive devices are part of the subsequent strip of passive devices 436 within the approximate form factor of the five strip of subsequent passive devices 436.

In an embodiment, a third strip of passive devices 438 such as a strip of decoupling capacitors 438 are also suspended from the organic reverse bridge 20. In an embodiment, the third strip of passive devices 438 is a single decoupling capacitor that takes a form factor approximately as illustrated. In an embodiment, the third strip of passive devices 438 is a group of nine passive devices. In an embodiment, up to 37 passive devices are part of the third strip of passive devices 438 within the approximate form factor of the nine third strip of passive devices 438.

In an embodiment, a fourth strip of passive devices 440 such as a strip of decoupling capacitors 440 are suspended from the organic reverse bridge 20. In an embodiment, the fourth strip of passive devices 440 is a single decoupling capacitor that takes a form factor approximately as illustrated. In an embodiment, the fourth strip of passive devices 440 is a group of nine passive devices. In an embodiment, up to 37 passive devices are part of the fourth strip of passive devices 440 within the approximate form factor of the nine fourth strip of passive devices 438.

Figure 5A:
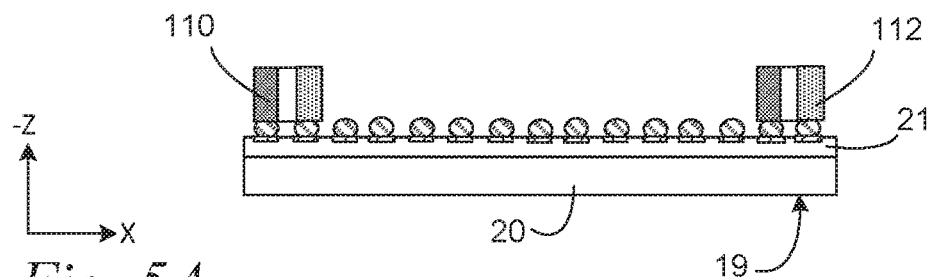
FIGS. 5A through 5C are process-flow depictions for assembling the integrated-circuit device package, depicted in FIGS. 1 and 1A, where a die-edge-level passive device is coupled to an integrated-circuit die, through a reverse-bridge configuration according to several embodiments.
Figure 5B:
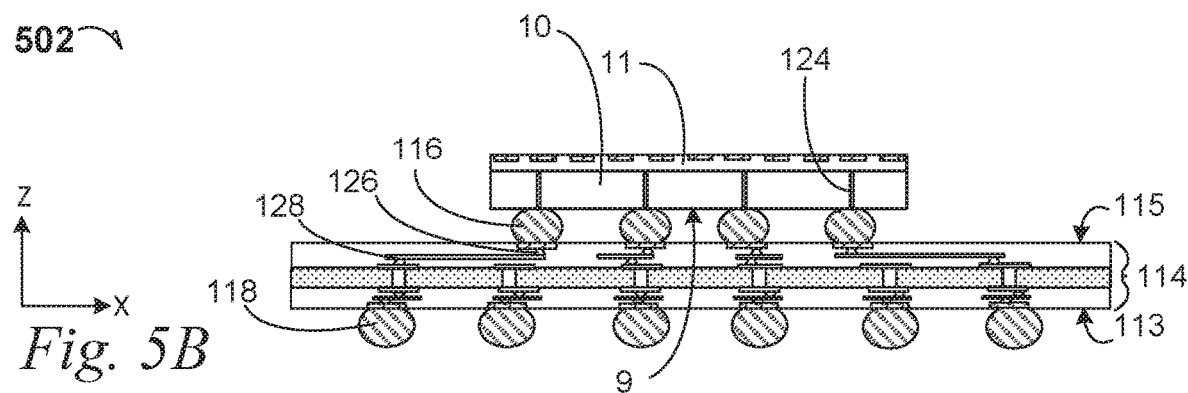
Figure 5C:
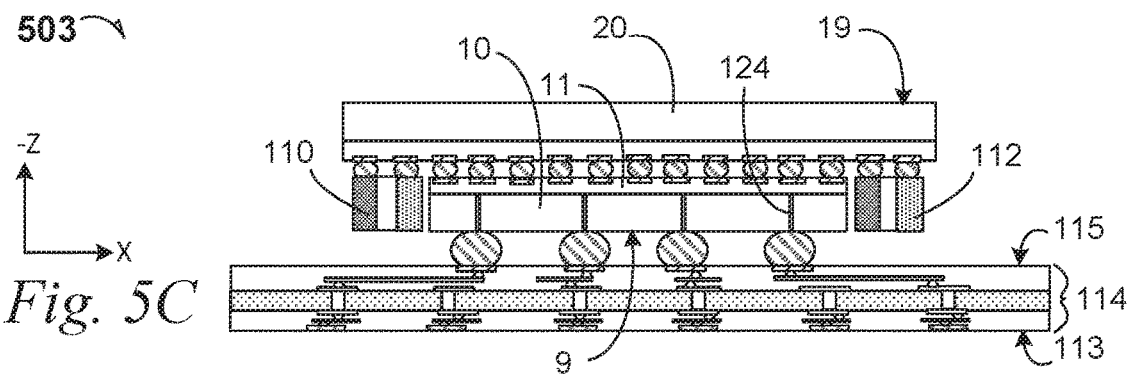

FIGS. 5A through 5C are process-flow depictions for assembling the integrated-circuit device package 100, depicted in FIGS. 1 and 1A, where a die-edge-level passive device 110 is coupled to an integrated-circuit die 10, through a reverse-bridge 20 configuration according to several embodiments.

At FIG. 5A, the Z-direction is inverted compared to FIG. 1, and the reverse-bridge IC die 20 is depicted where the first and subsequent passive devices 110 and 112 are assembled onto the active devices and metallization level 21.

At FIG. 5B, the Z-direction has been restored. The first IC die 10 has been seated on the die-side surface 115 of the IC package substrate, in preparation for receiving the reverse-bridge IC die 20 depicted in FIG. 5A.

At FIG. 5C, the reverse-bridge IC die 20 is face-to-face bonded to the first IC die 10, such that the first and subsequent passive devices 110 and 112, are suspended from the reverse-bridge IC die 20 above the die-side surface 115 of the IC package substrate 114. In an embodiment, the underfill material 122, depicted in FIG. 1, is first flowed between the first IC die 10 and the reverse-bridge IC die 20, before a molding material 120 is formed upon the die side 115 to encapsulate the IC die 10 and at least part of the reverse-bridge die 20.

Processing is similar for the several IC packages 200, 300 and 400. For example, passive devices 210 and 212 are assembled to reverse-bridge structures 20 and 22 (and 24 and 26 as illustrated in FIG. 2A), followed by assembling the reverse-bridge structures to the IC die 10. Similarly as illustrated in FIG. 3 for example, passive devices 310 and 312 are assembled to the compute IC die 10 at the IC die back-side surface 9, followed by assembling the IC die 10 to the IC package die-side surface 315. Similarly as illustrated in FIG. 4 for example, passive devices 410 and 412 are assembled to the frame-shaped, organic reverse bridge 20 in FIG. 4A, followed by seating the organic reverse bridge 20 to the IC die 10.

Figure 6:
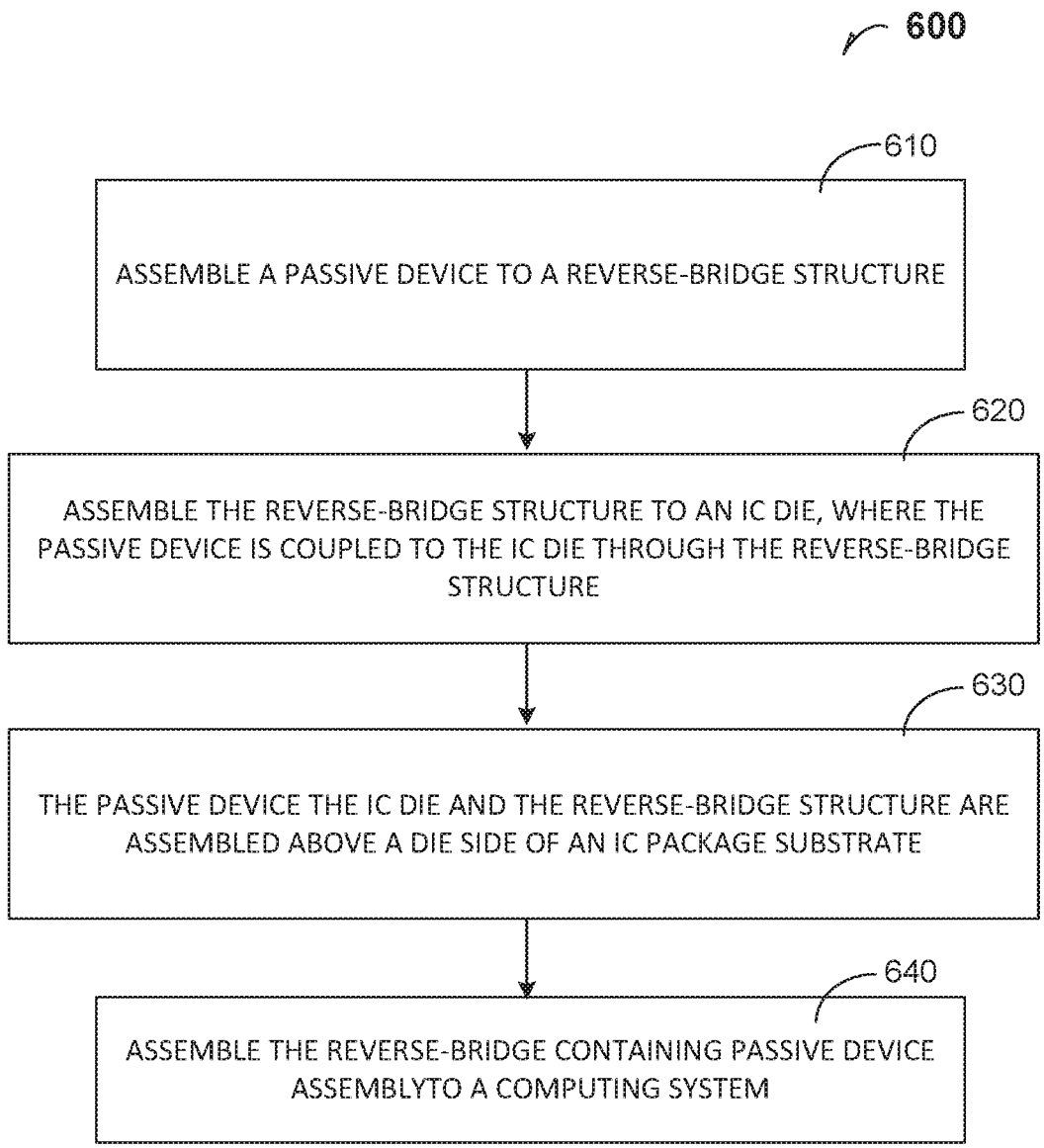
FIG. 6 is a process flow diagram according to several embodiments.

FIG. 6 is a process flow diagram 600 according to several embodiments.

At 610, the process includes assembling a passive device to a reverse-bridge structure. In a non-limiting example embodiment, the reverse-bridge IC die 20 in FIG. 5A is depicted where the first and subsequent passive devices 110 and 112 are assembled onto the active devices and metallization level 21.

At 620, the process includes assembling the reverse-bridge structure to an IC die.

At 630, the process of assembly at 620, results in the IC die, the reverse-bridge structure and the passive device are assembled above a die side of an IC package substrate. In a non-limiting example embodiment, at FIG. 5C, the reverse-bridge IC die 20 is face-to-face bonded to the first IC die 10, such that the first and subsequent passive devices 110 and 112, are suspended from the reverse-bridge IC die 20 above the die-side surface 115 of the IC package substrate 114.

Figure 7:
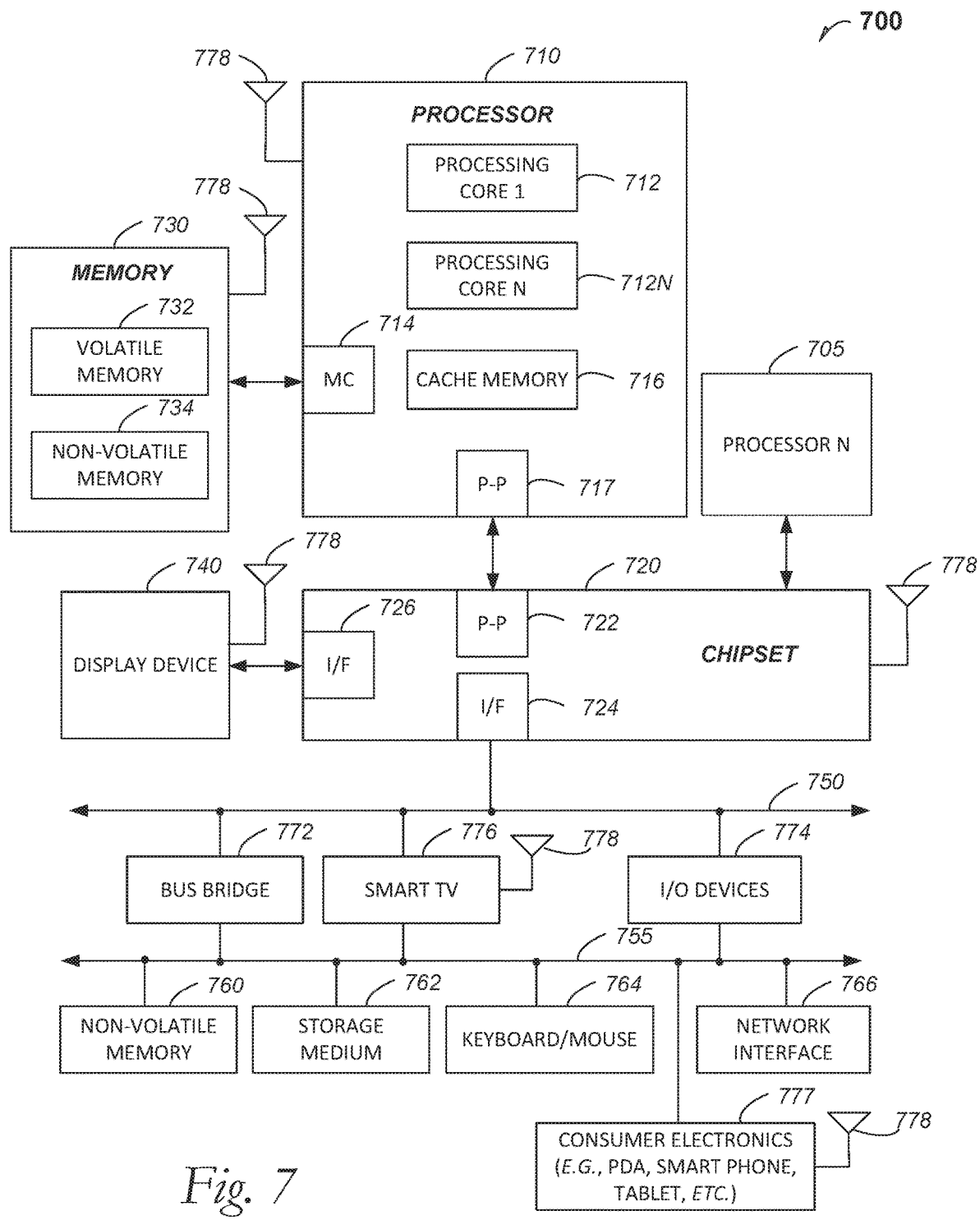
FIG. 7 is included to show an example of a higher-level device application for the disclosed embodiments.

FIG. 7 is included to show an example of a higher-level device application for the disclosed embodiments. The reverse-bridge passive-device containing integrated-circuit package embodiments may be found in several parts of a computing system. In an embodiment, the reverse-bridge passive-device containing integrated-circuit package embodiments can be part of a communications apparatus such as is affixed to a cellular communications tower. In an embodiment, a computing system 700 includes, but is not limited to, a desktop computer. In an embodiment, a computing system 700 includes, but is not limited to a laptop computer. In an embodiment, a computing system 700 includes, but is not limited to a tablet. In an embodiment, a computing system 700 includes, but is not limited to a notebook computer. In an embodiment, a computing system 700 includes, but is not limited to a personal digital assistant (PDA). In an embodiment, a computing system 700 includes, but is not limited to a server. In an embodiment, a computing system 700 includes, but is not limited to a workstation. In an embodiment, a computing system 700 includes, but is not limited to a cellular telephone. In an embodiment, a computing system 700 includes, but is not limited to a mobile computing device. In an embodiment, a computing system 700 includes, but is not limited to a smart phone. In an embodiment, a system 700 includes, but is not limited to an internet appliance. Other types of computing devices may be configured with the microelectronic device that includes reverse-bridge passive-device containing integrated-circuit package embodiments.

In an embodiment, the processor 710 has one or more processing cores 712 and 712N, where 712N represents the Nth processor core inside processor 710 where N is a positive integer. In an embodiment, the electronic device system 700 using a reverse-bridge passive-device containing integrated-circuit package embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the reverse-bridge passive-device containing integrated-circuit package element on an integrated-circuit package substrate in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. In an embodiment, the chipset 720 is part of a reverse-bridge passive-device containing integrated-circuit package embodiment depicted, e.g. in FIGS. 1 and 1A, 2 and 2A, 3 and 3A, 4 and 4A and 5A through 5C.

The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a reverse-bridge passive-device containing integrated-circuit package embodiment as set forth in this disclosure. The chipset 720 enables the processor 710 to connect to other elements in a reverse-bridge passive-device containing integrated-circuit package embodiment in a system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a reverse-bridge passive-device containing integrated-circuit package embodiment in a system. Additionally, the chipset 720 connects to one or more buses 750 and 755 that interconnect various elements 774, 760, 762, 764, and 766. Buses 750 and 755 may be interconnected together via a bus bridge 772 such as at least one reverse-bridge passive-device containing integrated-circuit package embodiment. In an embodiment, the chipset 720, via interface 724, couples with a non-volatile memory 760, a mass storage device(s) 762, a keyboard/mouse 764, a network interface 766, smart TV 776, and the consumer electronics 777, etc.

In an embodiment, the mass storage device 762 includes, but is not limited to, a solid-state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the reverse-bridge passive-device containing integrated-circuit package embodiments in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

To illustrate the reverse-bridge passive-device containing integrated-circuit package IC package embodiments and methods disclosed herein, a non-limiting list of examples is provided herein:

Example 1 is an integrated-circuit package apparatus, comprising: a passive device on a structure above a die side of an integrated-circuit package substrate; and an integrated-circuit (IC) die couple to the passive device, through the structure, wherein the IC die is above the die side of the IC package substrate, and wherein the passive device and the IC die are coupled to the IC package substrate by a through-silicon via (TSV).

In Example 2, the subject matter of Example 1 optionally includes wherein the IC die is an IC base die, wherein the structure is a compute IC die that is face-to-face coupled to the IC base die, and wherein the TSV is in the IC base die, further including: an electrical bump that contacts the TSV at a backside surface of the IC base die, wherein the electrical bump contacts the die side of the IC package substrate.

In Example 3, the subject matter of any one or more of Examples 1-2 optionally include wherein the IC die is an IC base die, wherein the structure is a compute IC die that is face-to-face coupled to the IC base die, and wherein the TSV is in the IC base die, further including: an electrical bump that contacts the TSV at a backside surface of the IC base die, wherein the electrical bump contacts a die side of the IC package substrate; and a molding mass that contacts the passive device and the IC base die, and wherein the molding mass at least partially encapsulates the IC compute die.

In Example 4, the subject matter of any one or more of Examples 1-3 optionally include wherein the IC die is an IC base die, wherein the structure is a compute IC die that is face-to-face coupled to the IC base die, wherein the TSV is in the IC base die, and wherein the passive device is a first passive device, further including: a subsequent passive device on the compute IC die, wherein the first and subsequent passive devices are suspended from the compute IC die at opposite sides, above a die side of the IC package substrate.

In Example 5, the subject matter of any one or more of Examples 1-4 optionally include wherein the IC die is an IC base die, wherein the structure is a compute IC die that is face-to-face coupled to the IC base die, and wherein the TSV is in the IC base die, further including: an electrical bump that contacts the TSV at a backside surface of the IC base die, wherein the electrical bump contacts a die side of the IC package substrate; a molding mass that contacts the passive device and the IC base die, and wherein the molding mass at least partially encapsulates the IC compute die; and a subsequent passive device on the compute IC die, wherein the first and subsequent passive devices are suspended from the compute IC die at opposite sides, above the die side of the IC package substrate.

In Example 6, the subject matter of any one or more of Examples 1-5 optionally include wherein the IC die is a compute IC die, wherein the structure is a silicon bridge die that is coupled to the compute IC die by the TSV, wherein the TSV is in the compute IC die, and wherein the compute IC die is flip-chip coupled to a die side of the IC package substrate, further including: wherein the passive device is suspended from the silicon-bridge die at an edge level of the compute IC die; an electrical bump that contacts the TSV at active devices and metallization of the compute IC die, wherein the electrical bump contacts the die side of the IC package substrate.

In Example 7, the subject matter of any one or more of Examples 1-6 optionally include wherein the IC die is an IC base die, wherein the structure is a silicon bridge die that is coupled to the IC base die by the TSV, wherein the TSV is in the IC base die, and wherein the IC base die is flip-chip coupled to a die side of the IC package substrate, further including: an electrical bump that contacts the TSV at active devices and metallization of the IC base die, wherein the electrical bump contacts the die side of the IC package substrate; and a molding mass that contacts the passive device and the IC base die, and wherein the molding mass at least partially encapsulates the silicon bridge die.

In Example 8, the subject matter of any one or more of Examples 1-7 optionally include wherein the IC die is an IC base die, wherein the structure is a first silicon-bridge die that is coupled to the IC base die by the TSV, wherein the TSV is a first TSV in the IC base die, wherein the passive device is a first passive device that is suspended from the first silicon-bridge die at an edge level of the IC base die; and wherein the IC base die is flip-chip coupled to a die side of the IC package substrate, further including: a subsequent silicon-bridge die coupled to the IC base die by a subsequent TSV in the IC base die; a subsequent passive device suspended from the subsequent silicon-bridge die at an edge level of the IC base die; a first electrical bump that contacts the first TSV at active devices and metallization of the IC base die, wherein the first electrical bump contacts the die side of the IC package substrate; a subsequent electrical bump that contacts the subsequent TSV at active devices and metallization of the IC base die, wherein the subsequent electrical bump contacts the die side of the IC package substrate; and a molding mass that contacts the passive device and the IC base die, and wherein the molding mass at least partially encapsulates the first and subsequent silicon bridge dice.

In Example 9, the subject matter of any one or more of Examples 1-8 optionally include wherein the IC die includes active devices and metallization, and wherein the structure is a backside surface of the IC die, opposite the active devices and metallization.

In Example 10, the subject matter of any one or more of Examples 1-9 optionally include wherein the TSV is a first TSV, wherein the passive device is a first passive device, further including: a subsequent passive device on the backside surface, wherein the subsequent passive device is coupled to the IC die by a subsequent TSV in the IC die.

In Example 11, the subject matter of any one or more of Examples 1-10 optionally include a molding mass that contacts the IC package substrate at a die side, the IC die, and wherein the molding mass at least partially encapsulates the passive device.

In Example 12, the subject matter of any one or more of Examples 1-11 optionally include wherein the IC die is an IC base die, wherein the structure is an organic reverse-bridge that is coupled to the IC base die by the TSV, wherein the TSV is in the IC base die, and wherein the IC base die is flip-chip coupled to a die side of the IC package substrate, further including: wherein the passive device is suspended from the organic reverse-bridge at an edge level of the IC base die; an electrical bump that contacts the TSV at active devices and metallization of the IC base die, wherein the electrical bump contacts the die side of the IC package substrate.

In Example 13, the subject matter of any one or more of Examples 1-12 optionally include wherein the IC die is an IC base die, wherein the structure is an organic reverse-bridge that is coupled to the IC base die by the TSV, wherein the TSV is in the IC base die, and wherein the IC base die is flip-chip coupled to a die side of the IC package substrate, further including: an electrical bump that contacts the TSV at active devices and metallization of the IC base die, wherein the electrical bump contacts the die side of the IC package substrate; and a molding mass that contacts the passive device and the IC base die, and wherein the molding mass at least partially encapsulates the organic reverse-bridge.

In Example 14, the subject matter of any one or more of Examples 1-13 optionally include wherein the IC die is an IC base die, wherein the structure is an organic reverse-bridge that is coupled to the IC base die by the TSV, wherein the TSV is in the IC base die, and wherein the IC base die is flip-chip coupled to a die side of the IC package substrate, and wherein the organic reverse-bridge has a frame form factor that creates an infield on the IC base die at a backside surface, further including: an electrical bump that contacts the TSV at active devices and metallization of the IC base die, wherein the electrical bump contacts the die side of the IC package substrate; and a molding mass that contacts the passive device and the IC base die, and wherein the molding mass at least partially encapsulates the organic reverse-bridge.

Example 15 is a computing system, comprising: an integrated-circuit (IC) package substrate including a die side and a land side; a first IC die contacting an electrical bump on the IC package substrate die side; a reverse-bridge IC die on the first IC die, wherein the first IC die and the reverse-bridge IC die are face-to-face coupled at active devices and metallization of the first IC die; a passive device on a reverse-bridge IC die, wherein the passive device is suspended above the IC package substrate die side, and wherein the passive device and the first IC die are coupled to the IC package substrate by a through-silicon via (TSV) in the first IC die; an electrical bump that contacts the TSV at a backside surface of the first IC die, wherein the electrical bump contacts the die side of the IC package substrate; a printed wiring board coupled to the IC package substrate; and a chipset at least partly on the printed wiring board.

In Example 16, the subject matter of Example 15 optionally includes a protective shell that is an integral portion of the printed wiring board, and wherein the wherein the computing system is selected from the group consisting of a hand-held computing platform, a telephone and a drone.

In Example 17, the subject matter of any one or more of Examples 15-16 optionally include wherein IC die is an IC base die, wherein the reverse-bridge IC die is a compute IC die that is face-to-face coupled to the IC base die, and wherein the TSV is in the IC base die, further including: an electrical bump that contacts the TSV at a backside surface of the IC base die, wherein the electrical bump contacts the die side of the IC package substrate; and a molding mass that contacts the passive device and the IC base die, and wherein the molding mass at least partially encapsulates the IC compute die.

In Example 18, the subject matter of any one or more of Examples 15-17 optionally include wherein IC die is an IC base die, wherein the reverse-bridge IC die is a compute IC die that is face-to-face coupled to the IC base die, wherein the TSV is in the IC base die, and wherein the passive device is a first passive device, further including: a subsequent passive device on the compute IC die, wherein the first and subsequent passive devices are suspended from the compute IC die, above the die side of the IC package substrate.

In Example 19, the subject matter of any one or more of Examples 15-18 optionally include wherein IC die is an IC base die, wherein the reverse-bridge IC die is a compute IC die that is face-to-face coupled to the IC base die, and wherein the TSV is in the IC base die, further including: an electrical bump that contacts the TSV at a backside surface of the IC base die, wherein the electrical bump contacts a die side of the IC package substrate; a molding mass that contacts the passive device and the IC base die, and wherein the molding mass at least partially encapsulates the IC compute die; and a subsequent passive device on the compute IC die, wherein the first and subsequent passive devices are suspended from the compute IC die, above the die side of the IC package substrate.

Example 20 is a process of assembling a reverse-bridge structure to an integrated-circuit die, comprising: assembling a passive device to a structure; assembling an integrated-circuit (IC) die to an IC package substrate, wherein the IC package substrate includes a die side and a land side, and wherein assembling the IC die is to the die side; and wherein the passive device is suspended above the die side.

In Example 21, the subject matter of Example 20 optionally includes wherein the structure is a reverse-bridge IC die, wherein the IC die is a compute IC die, further including: assembling the compute IC die to a base IC die, wherein the base IC die is coupled at the IC package substrate die side; and forming a molding mass to contact the IC package die side, the base IC die, the passive device, and to at least partially encapsulate the reverse-bridge IC die.

In Example 22, the subject matter of any one or more of Examples 20-21 optionally include wherein the structure is a reverse-bridge IC die, wherein the IC die is a compute IC die, further including: assembling the compute IC die to a base IC die, wherein the base IC die is coupled at the IC package substrate die side; forming a molding mass to contact the IC package die side, the base IC die, the passive device, and to at least partially encapsulate the reverse-bridge IC die; and assembling a heat spreader to the reverse-bridge IC die.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated-circuit package apparatus, comprising:
   a passive device on a structure above a die side of an integrated-circuit package substrate; and
   an integrated-circuit (IC) die coupled to the passive device, through the structure, wherein the IC die is above the die side of the IC package substrate, and wherein communication between the passive device and the IC package substrate must pass through a through-silicon via (TSV), wherein the passive device is located laterally adjacent to the integrated-circuit (IC) die.

2. The integrated-circuit package apparatus of claim 1, wherein the IC die is an IC base die, wherein the structure includes a compute IC die that is face-to-face coupled to the IC base die, and wherein the TSV is in the IC base die, further including:
   an electrical bump that contacts the TSV at a backside surface of the IC base die, wherein the electrical bump contacts the die side of the compute IC die.

3. The integrated-circuit package apparatus of claim 1, wherein the IC die is an IC base die, wherein the structure is a compute IC die that is face-to-face coupled to the IC base die, and wherein the TSV is in the IC base die, further including:
   an electrical bump that contacts the TSV at a backside surface of the IC base die, wherein the electrical bump contacts a die side of the compute IC die; and
   a molding mass that contacts the passive device and the IC base die, and wherein the molding mass at least partially encapsulates the IC compute die.

4. The integrated-circuit package apparatus of claim 1, wherein the IC die is an IC base die, wherein the structure is a compute IC die that is face-to-face coupled to the IC base die, wherein the TSV is in the IC base die, and wherein the passive device is a first passive device, further including:
   a subsequent passive device on the compute IC die, wherein the first and subsequent passive devices are suspended from the compute IC die at opposite sides, above a die side of the IC package substrate.

5. The integrated-circuit package apparatus of claim 1, wherein the IC die is an IC base die, wherein the structure is a compute IC die that is face-to-face coupled to the IC base die, and wherein the TSV is in the IC base die, further including:

an electrical bump that contacts the TSV at a backside surface of the IC base die, wherein the electrical bump contacts a die side of the compute IC die;

a molding mass that contacts the passive device and the IC base die, and wherein the molding mass at least partially encapsulates the IC compute die; and a subsequent passive device on the compute IC die, wherein the first and subsequent passive devices are suspended from the compute IC die at opposite sides, above the die side of the IC package substrate.

6. The integrated-circuit package apparatus of claim 1, wherein the IC die is a compute IC die, wherein the structure is a silicon bridge die that is coupled to the compute IC die by the TSV, wherein the TSV is in the compute IC die, and wherein the compute IC die is flip-chip coupled to a die side of the IC package substrate, further including:

wherein the passive device is suspended from the silicon-bridge die at an edge level of the compute IC die;

an electrical bump that contacts the TSV at active devices and metallization of the compute IC die, wherein the electrical bump contacts the die side of the silicon bridge die.

7. The integrated-circuit package apparatus of claim 1, wherein the IC die is an IC base die, wherein the structure is a silicon bridge die that is coupled to the IC base die by the TSV, wherein the TSV is in the IC base die, and wherein the IC base die is flip-chip coupled to a die side of the IC package substrate, further including:

an electrical bump that contacts the TSV at active devices and metallization of the IC base die, wherein the electrical bump contacts the die side of the silicon bridge die; and a molding mass that contacts the passive device and the IC base die, and wherein the molding mass at least partially encapsulates the silicon bridge die.

8. The integrated-circuit package apparatus of claim 1, wherein the IC die is an IC base die, wherein the structure is a first silicon-bridge die that is coupled to the IC base die by the TSV, wherein the TSV is a first TSV in the IC base die, wherein the passive device is a first passive device that is suspended from the first silicon-bridge die at an edge level of the IC base die;

and wherein the IC base die is flip-chip coupled to a die side of the IC package substrate, further including:

a subsequent silicon-bridge die coupled to the IC base die by a subsequent TSV in the IC base die;

a subsequent passive device suspended from the subsequent silicon-bridge die at an edge level of the IC base die;

a first electrical bump that contacts the first TSV at active devices and metallization of the IC base die, wherein the first electrical bump contacts the die side of the first silicon-bridge die;

a subsequent electrical bump that contacts the subsequent TSV at active devices and metallization of the IC base die, wherein the subsequent electrical bump contacts the die side of the subsequent silicon-bridge die; and a molding mass that contacts the passive device and the IC base die, and wherein the molding mass at least partially encapsulates the first and subsequent silicon bridge dice.

9. The integrated-circuit package apparatus of claim 1, wherein the IC die includes active devices and metallization, and wherein the structure is coupled to a backside surface of the IC die, opposite the active devices and metallization.

10. The integrated-circuit package apparatus of claim 9, wherein the TSV is a first TSV, wherein the passive device is a first passive device, further including:

a subsequent passive device on the backside surface, wherein the subsequent passive device is coupled to the IC die by a subsequent TSV in the IC die.

11. The integrated-circuit package apparatus of claim 1, further including a molding mass that contacts the IC package substrate at a die side, the IC die, and wherein the molding mass at least partially encapsulates the passive device.

12. The integrated-circuit package apparatus of claim 1, wherein the IC die is an IC base die, wherein the structure is an organic reverse-bridge that is coupled to the IC base die by the TSV, wherein the TSV is in the IC base die, and wherein the IC base die is flip-chip coupled to a die side of the IC package substrate, further including:

wherein the passive device is suspended from the organic reverse-bridge at an edge level of the IC base die;

an electrical bump that contacts the TSV at active devices and metallization of the IC base die, wherein the electrical bump contacts the die side of the organic reverse-bridge.

13. The integrated-circuit package apparatus of claim 1, wherein the IC die is an IC base die, wherein the structure is an organic reverse-bridge that is coupled to the IC base die by the TSV, wherein the TSV is in the IC base die, and wherein the IC base die is flip-chip coupled to a die side of the IC package substrate, further including:

an electrical bump that contacts the TSV at active devices and metallization of the IC base die, wherein the electrical bump contacts the die side of the organic reverse-bridge; and a molding mass that contacts the passive device and the IC base die, and wherein the molding mass at least partially encapsulates the organic reverse-bridge.

14. The integrated-circuit package apparatus of claim 1, wherein the IC die is an IC base die, wherein the structure is an organic reverse-bridge that is coupled to the IC base die by the TSV, wherein the TSV is in the IC base die, and wherein the IC base die is flip-chip coupled to a die side of the IC package substrate, and wherein the organic reverse-bridge has a frame form factor that creates an infield on the IC base die at a backside surface, further including:

an electrical bump that contacts the TSV at active devices and metallization of the IC base die, wherein the electrical bump contacts the die side of the organic reverse-bridge; and a molding mass that contacts the passive device and the IC base die, and wherein the molding mass at least partially encapsulates the organic reverse-bridge.

15. A computing system, comprising:

an integrated-circuit (IC) package substrate including a die side and a land side;

a first IC die contacting an electrical bump on the IC package substrate die side;

a reverse-bridge IC die on the first IC die, wherein the first IC die and the reverse-bridge IC die are face-to-face coupled at active devices and metallization of the first IC die;

a passive device on a reverse-bridge IC die, wherein the passive device is suspended above the IC package substrate die side, and wherein communication between the passive device and the IC package substrate must pass through a through-silicon via (TSV) in the first IC die, wherein the passive device is located laterally adjacent to the first IC die;

an electrical bump that contacts the TSV at a backside surface of the first IC die, wherein the electrical bump contacts the die side of the reverse-bridge IC die;
a printed wiring board coupled to the IC package substrate; and
a chipset at least partly on the printed wiring board.

16. The computing system of claim 15, further including a protective shell that is an integral portion of the printed wiring board, and wherein the wherein the computing system is selected from the group consisting of a hand-held computing platform, a telephone and a drone.

17. The computing system of claim 15, wherein IC die is an IC base die, wherein the reverse-bridge IC die is a compute IC die that is face-to-face coupled to the IC base die, and wherein the TSV is in the IC base die, further including:
an electrical bump that contacts the TSV at a backside surface of the IC base die, wherein the electrical bump contacts the die side of the compute IC die; and
a molding mass that contacts the passive device and the IC base die, and wherein the molding mass at least partially encapsulates the IC compute die.

18. The computing system of claim 15, wherein IC die is an IC base die, wherein the reverse-bridge IC die is a compute IC die that is face-to-face coupled to the IC base die, wherein the TSV is in the IC base die, and wherein the passive device is a first passive device, further including:
a subsequent passive device on the compute IC die, wherein the first and subsequent passive devices are suspended from the compute IC die, above the die side of the IC package substrate.

19. The computing system of claim 15, wherein IC die is an IC base die, wherein the reverse-bridge IC die is a compute IC die that is face-to-face coupled to the IC base die, and wherein the TSV is in the IC base die, further including:
an electrical bump that contacts the TSV at a backside surface of the IC base die, wherein the electrical bump contacts a die side of the compute IC die;
a molding mass that contacts the passive device and the IC base die, and wherein the molding mass at least partially encapsulates the compute IC die; and
a subsequent passive device on the compute IC die, wherein the first and subsequent passive devices are suspended from the compute IC die, above the die side of the IC package substrate.

* * * * *